United States Patent
Zemer et al.

(10) Patent No.: US 9,641,158 B2
(45) Date of Patent: May 2, 2017

(54) LOW POWER DECIMATOR

(71) Applicant: Apple Inc., Cupertino, CA (US)

(72) Inventors: Tzach Zemer, Haifa (IL); Joseph J. Cheng, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/831,708

(22) Filed: Aug. 20, 2015

(65) Prior Publication Data
US 2017/0054433 A1  Feb. 23, 2017

(51) Int. Cl.
*H04R 3/04* (2006.01)
*H03G 5/00* (2006.01)
*H03H 17/06* (2006.01)

(52) U.S. Cl.
CPC .......... *H03H 17/0664* (2013.01); *H04R 3/04* (2013.01)

(58) Field of Classification Search
CPC . H01L 2224/48091; H01L 2924/00014; H01L 27/14625; F21Y 2101/00; F21Y 2115/10; H03H 17/0664; H04R 3/04
See application file for complete search history.

(56) References Cited

U.S. PATENT DOCUMENTS

| | | | |
|---|---|---|---|
| 8,009,842 B2 | 8/2011 | Richardson et al. | |
| 8,405,532 B1 | 3/2013 | Clark et al. | |
| 2011/0286606 A1 | 11/2011 | Al-Naimi et al. | |
| 2012/0155666 A1 | 6/2012 | Nair | |
| 2015/0127333 A1* | 5/2015 | Ubale | H04R 1/005 704/229 |

* cited by examiner

*Primary Examiner* — Muhammad N Edun
(74) *Attorney, Agent, or Firm* — Rory D. Rankin; Meyertons, Hood, Kivlin, Kowert & Goetzel, P.C.

(57) ABSTRACT

Systems, apparatuses, and methods for implementing a low power decimator. A decimator may receive a plurality of input samples from a digital microphone. The decimator may include one or more coefficient tables for storing values combining two or more filter coefficients for filtering the received samples. The decimator may utilize a concatenation of multiple samples to perform a lookup of a corresponding coefficient table. The coefficient tables may store only the necessary non-redundant values for all coefficient combinations which can be applied to the multiple samples. The result of the lookup of the coefficient table may have its sign inverted or be zeroed based on the values of the multiple samples.

20 Claims, 11 Drawing Sheets

Table 800

| Sample 710 | Sample 712 | Sample 722 | Sample 724 | Resultant Coefficient Values | Index | Mux Select |
|---|---|---|---|---|---|---|
| 0 | 0 | 0 | 0 | $-2C_0 - 2C_1$ | $D_0$ | negative |
| 0 | 0 | 0 | 1 | $-2C_1$ | $D_3$ | negative |
| 0 | 0 | 1 | 0 | $-2C_0$ | $D_2$ | negative |
| 0 | 0 | 1 | 1 | 0 | x | 0 |
| 0 | 1 | 0 | 0 | $-2C_0$ | $D_2$ | negative |
| 0 | 1 | 0 | 1 | 0 | x | 0 |
| 0 | 1 | 1 | 0 | $-2C_0 + 2C_1$ | $D_1$ | negative |
| 0 | 1 | 1 | 1 | $2C_1$ | $D_3$ | positive |
| 1 | 0 | 0 | 0 | $-2C_1$ | $D_3$ | negative |
| 1 | 0 | 0 | 1 | $2C_0 - 2C_1$ | $D_1$ | positive |
| 1 | 0 | 1 | 0 | 0 | x | 0 |
| 1 | 0 | 1 | 1 | $2C_0$ | $D_2$ | positive |
| 1 | 1 | 0 | 0 | 0 | x | 0 |
| 1 | 1 | 0 | 1 | $2C_0$ | $D_2$ | positive |
| 1 | 1 | 1 | 0 | $2C_1$ | $D_3$ | positive |
| 1 | 1 | 1 | 1 | $2C_0 + 2C_1$ | $D_0$ | positive |

LOW POWER DECIMATOR

BACKGROUND

Technical Field

Embodiments described herein relate to the field of signal processing and more particularly, to implementing a low power decimator.

Description of the Related Art

Mobile phone handsets typically include a microphone that converts input sound pressure waves into an output electrical audio signal. The electrical audio signal is sampled and then typically processed and stored by the handset. Other devices also include microphones for capturing sounds, and these devices also include circuitry for performing various types of digital signal processing on the captured sounds.

The circuitry for processing digital signals often includes decimators, filters, and/or other types of signal processing logic. A decimator may be configured to decimate received input samples from oversampled bitstreams. As used herein, the term "decimate" may be defined as reducing the sampling rate of a signal. Decimation may include, or be accompanied by, filtering to mitigate aliasing distortion. In one embodiment, a decimator may utilize a finite impulse response (FIR) filter to filter the input samples. The equation for a general FIR filter is:

$$y[n] = \sum_{i=0}^{N-1} x[n-i] * C[i]$$

where N is the filter length, $x[n-i]$ are the samples, and $C[i]$ are the coefficients. However, if only one out of every M FIR filter results is needed, effectively applying 1/M decimation, the equation will be:

$$y[n] = \sum_{i=0}^{N-1} x[Mn-i] * C[i]$$

With mobile and other devices running on battery power, techniques for reducing power consumption of the various signal processing circuitry (e.g., decimators) in the devices are desirable.

SUMMARY

Systems, apparatuses, and methods for implementing a low power decimator are contemplated.

In one embodiment, an apparatus may include a digital microphone and signal processing logic. The signal processing logic may include a multi-stage decimator, with each decimation stage implementing a finite impulse response (FIR) filter to filter the audio samples captured by the digital microphone. In the first decimation stage, the FIR filter may be implemented by utilizing a concatenation of multiple samples to perform lookups of one or more coefficient tables. For a given concatenation of samples, a lookup may be performed of a corresponding coefficient table. In various embodiments, the one or more coefficient tables may store only non-redundant values of the possible coefficient combinations so as to reduce the size of the tables. For example, a redundant value may be one that a) is easily derived from another entry in the coefficient table, or b) is a well-known constant such as the value zero. For example, if $C_0+C_1$ is stored then—$(C_0+C_1)$ does not need to be stored because it can be easily derived from sign inverting $C_0+C_1$. After a lookup of the one or more coefficient tables is performed, the result of the lookup may be sign inverted or zeroed depending on the value of the respective concatenation of samples.

After a plurality of lookups have been performed for a plurality of samples, the results of the plurality of lookups may be summed and then stored. Then, the input samples may be shifted ahead by 'M' samples, wherein 'M' is the decimation factor of the decimation stage, and wherein 'M' is a positive integer greater than one. A plurality of lookups may again be performed for the next collection of input samples, and the results of the plurality of lookups may be summed and then stored. When the end of the input samples has been reached, one or more additional decimation stages may be performed on the resultant sums of the first decimation stage.

In one embodiment, the first decimation stage may be configured to decimate one-bit pulse density modulation (PDM) audio samples generated by a digital microphone. The first decimation stage may operate at a higher frequency (e.g., 1.6 MHz, 800 kHz) than successive decimation stages. In one embodiment, the output of the last decimation stage may be 16-bit pulse code modulation (PCM) samples which may undergo additional processing and/or be stored.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

This specification includes references to "one embodiment". The appearance of the phrase "in one embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A system comprising a decimator . . . " Such a claim does not foreclose the system from including additional components (e.g., a processor, a display, a memory controller).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Figure 1:
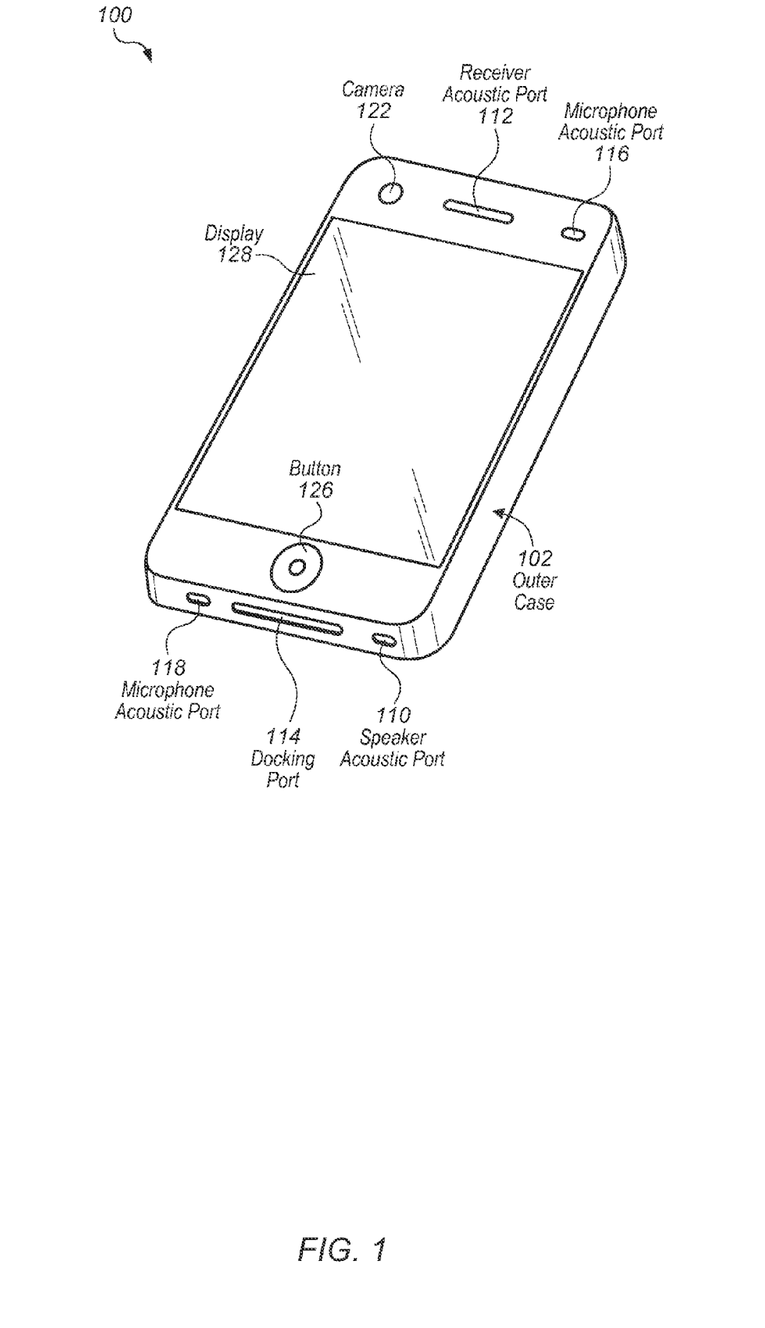
FIG. 1 illustrates one embodiment of a front perspective view of a mobile communications device.

Referring now to FIG. 1, a front perspective view of a mobile communications device 100 is shown. Device 100 may include an outer housing or case 102 defining or closing off a chamber in which the constituent electronic components of the device 100 are housed. Outer case 102 may include a substantially planar front face and a substantially planar rear face, which are connected by a sidewall portion. The front face may be considered a display side of the device in that it may include a touch screen display 128 that serves as an input and a display output for the device. The touch screen display 128 may be a touch sensor (e.g., those used in a typical touch screen display such as found in an iPhone® device by Apple Inc.). Although the touch screen is illustrated on the front face, if desired, it may be mounted on the back face of device 100, on a side wall of device 100, on a flip-up portion of device 100 that is attached to a main body portion of device 100 by a hinge (for example), or using any other suitable mounting arrangement. The rear face may form a back side of the device, which can be held by the user during operation of device 100. The example of device 100 is merely intended to illustrate one possible embodiment, and it should be understood that other housing styles and/or case structures may be utilized for device 100 in other embodiments.

To further enable its use as a mobile communications device, device 100 may include various acoustic openings or ports at different locations within outer case 102 to allow for transmission of acoustic signals to and from device 100. Representatively, outer case 102 may have formed therein a speaker acoustic port 110, a receiver acoustic port 112, and microphone acoustic ports 116 and 118. Although the acoustic ports are illustrated as separate ports, it is contemplated that any one or more of the illustrated ports may be combined into one port such that, for example, the transducers associated with the illustrated receiver or microphone ports may instead share the same port.

Microphone acoustic ports 116 and 118 may be located on the front face and sidewall of outer case 102 as illustrated. It should be understood that the number and location of microphone acoustic ports may vary in other embodiments. Each of the speaker acoustic port 110, receiver acoustic port 112, and microphone acoustic ports 116 and 118 may be associated with one or more transducers, which may be mounted within outer case 102. In the case of the microphone acoustic ports 116 and 118, the transducer may be an acoustic-to-electric transducer such as a microphone that converts sound into an electrical signal. The microphone may be any type of microphone capable of receiving acoustic energy and converting it into an electrical signal. For example, in one embodiment, the microphone may be a micro-electro-mechanical systems (MEMS) microphone, also referred to as a microphone chip or silicon microphone.

Device 100 may also include camera 122 which may be mounted to outer case 102 to capture still and/or video images of objects of interest. There may also be another camera on the back face of device 100. The outer case 102 may further include other input-output devices such as an earphone port (not shown) to receive an earphone plug, docking port 114 and command button 126. Docking port 114 may sometimes be referred to as a dock connector, 30-pin data port connector, input-output port, or bus connector, and may be used as an input-output port (e.g., when connecting device 100 to a mating dock connected to a computer or other electronic device). Command button 126 may be, for example, a menu button or a home button.

Figure 2:
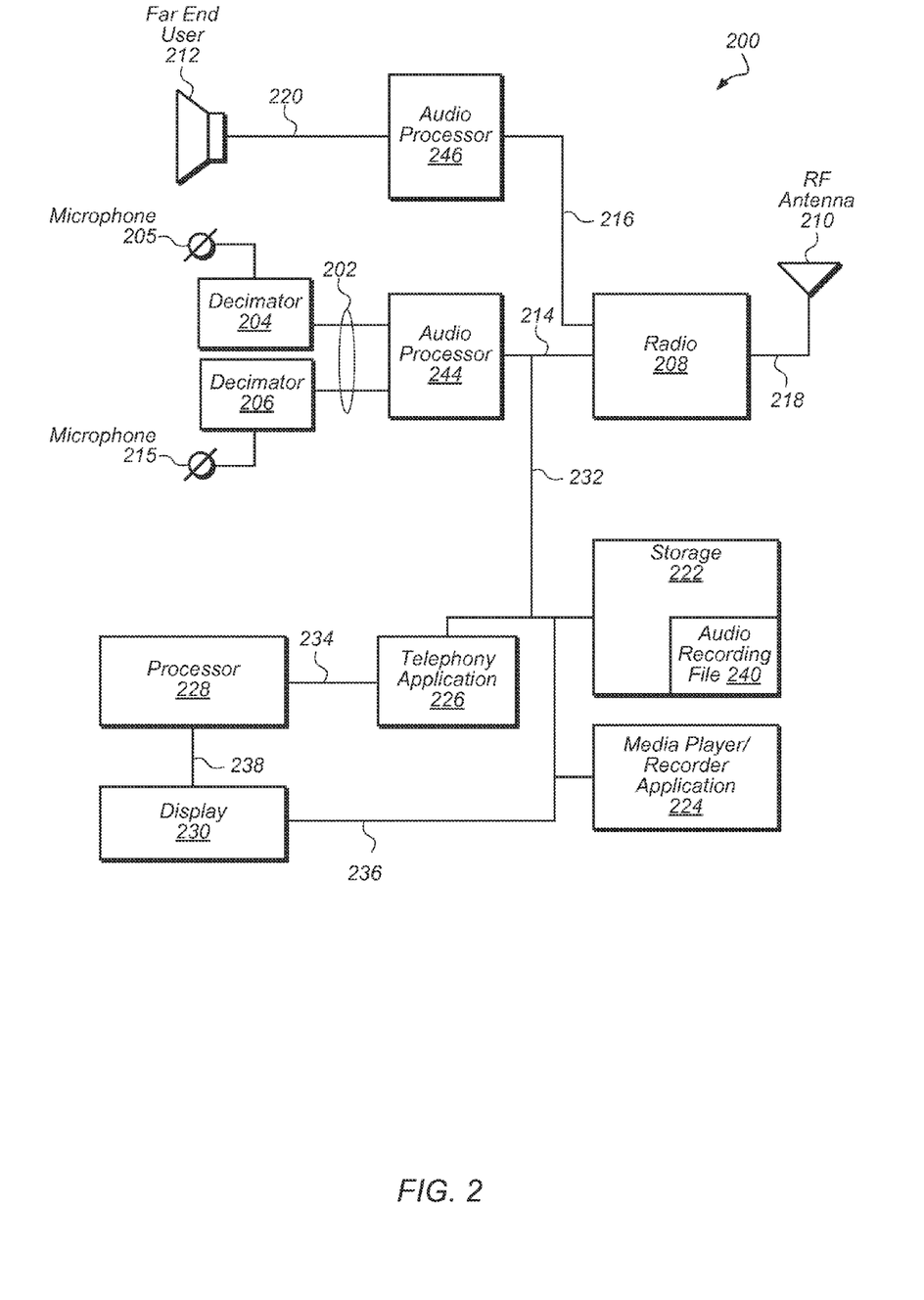
FIG. 2 is a block diagram of one embodiment of an electronic device.

Turning now to FIG. 2, a block diagram of one embodiment of an electronic device 200 is shown. In one embodiment, the circuitry of electronic device 200 shown in FIG. 2 may be included within the outer case 102 of device 100 (of FIG. 1). In various embodiments, device 200 may be a mobile telephone, a mobile telephone with media player capabilities, a handheld computer, a remote control, a game player, a watch, a television, a set-top box, a global positioning system (GPS) device, a laptop computer, a tablet computer, an ultra-portable computer, a combination of such devices, or any other suitable electronic device.

Device 200 may include processor 228 and storage 222, and storage 222 may include one or more different types of storage such as hard disk drive storage, nonvolatile memory (e.g., flash memory or other electrically-programmable-read-only memory), volatile memory (e.g., battery-based static or dynamic random-access-memory), etc. Processor 228 may be used to control the operation of device 200. In various embodiments, processor 228 may be a microprocessor and/or other suitable integrated circuits. In one embodiment, processor 228 and storage 222 may be used to run software on device 200, such as internet browsing applications, voice-over-internet-protocol (VoIP) telephone call applications, email applications, media playback applications, operating system functions, etc. Processor 228 and storage 222 may also be used to implement suitable communications protocols. Communications protocols that may be implemented using processor 228 and storage 222 include internet protocols, wireless local area network protocols (e.g., IEEE 802.11 protocols (or Wi-Fi®)), protocols for other short-range wireless communications links such as the Bluetooth® protocol, protocols for handling 3G or 4G communications services (e.g., using wide band code division multiple access techniques), 2G cellular telephone communications protocols, etc.

In one embodiment, each of microphones 205 and 215 may be located in a microphone acoustic port (e.g., microphone acoustic ports 116 and 118 of FIG. 1) of the outer housing (not shown) of device 200. Each microphone 205 and 215 may be coupled to a corresponding decimator 204 and 206. Each of decimators 204 and 206 may be configured to decimate the input samples received from a respective microphone. As used herein, the term "decimate" may be defined as reducing the sampling rate of a signal while utilizing filtering to mitigate aliasing distortion. In one embodiment, each of decimators 204 and 206 may utilize a finite impulse response (FIR) filter to compute every $N^{th}$ output, wherein 'N' is the decimation factor, and wherein 'N' may be any positive integer greater than one. In other embodiments, decimators 204 and 206 may utilize other types of filters to decimate the received input samples.

The outputs of decimators 204 and 206 may be coupled to audio processor 244 through paths 202. Each of decimators 204 and 206 may include a first-in first-out (FIFO) queue for buffering output samples before conveying the output samples to audio processor 244. Signals from microphones 205 and 215 may be transmitted through uplink audio signal path 214 to radio 208. Radio 208 may transmit the signals via downlink audio signal path 216 to audio processor 246, which is in communication with a far end user device 212 through path 220. Alternatively, radio 208 may transmit the signals to RF antenna 210 through path 218. Audio processor 244 may also be in communication with local storage 222, a media player/recorder application 224 or other telephony applications 226 on the device, through path 232, for local storage and/or recording of the audio signals (e.g., audio recording file 240) as desired. Processor 228 may further be in communication with these local devices via path 234 and also display 230 via path 238 to facilitate processing and display of information corresponding to the audio signals to the user. Display 230 may also be in direct communication with local storage 222 and applications 224 and 226 via path 236 as illustrated.

In one embodiment, each of microphones 205 and 215 may include an analog to digital converter (ADC) for creating digital samples of the captured audio signal. In another embodiment, each of decimators 204 and 206 may include an ADC for sampling the audio signal received from a respective microphone. In one embodiment, the audio signal may be sampled and encoded as a one-bit digital pulse-density modulation (PDM) stream. In this embodiment, for each sample, a value of '1' corresponds to a pulse of positive polarity while a value of '0' corresponds to a pulse of negative polarity. In one embodiment, each decimator 204 and 206 may generate a 16-bit pulse code modulation (PCM) signal output at 16 kHz. In other embodiments, decimator 204 and 206 may generate other types of outputs with other bit-widths and/or at other frequencies.

It is noted that the number of components of device 200 may vary from embodiment to embodiment. There may be more or fewer of each component than the number shown in FIG. 2. It is also noted that device 200 may include many other components not shown in FIG. 2. It should also be understood that the distribution of functionality illustrated in FIG. 2 is not the only possible arrangement of components which may be utilized for device 200. Other devices may include a different arrangement of functionality among the components.

Figure 3:
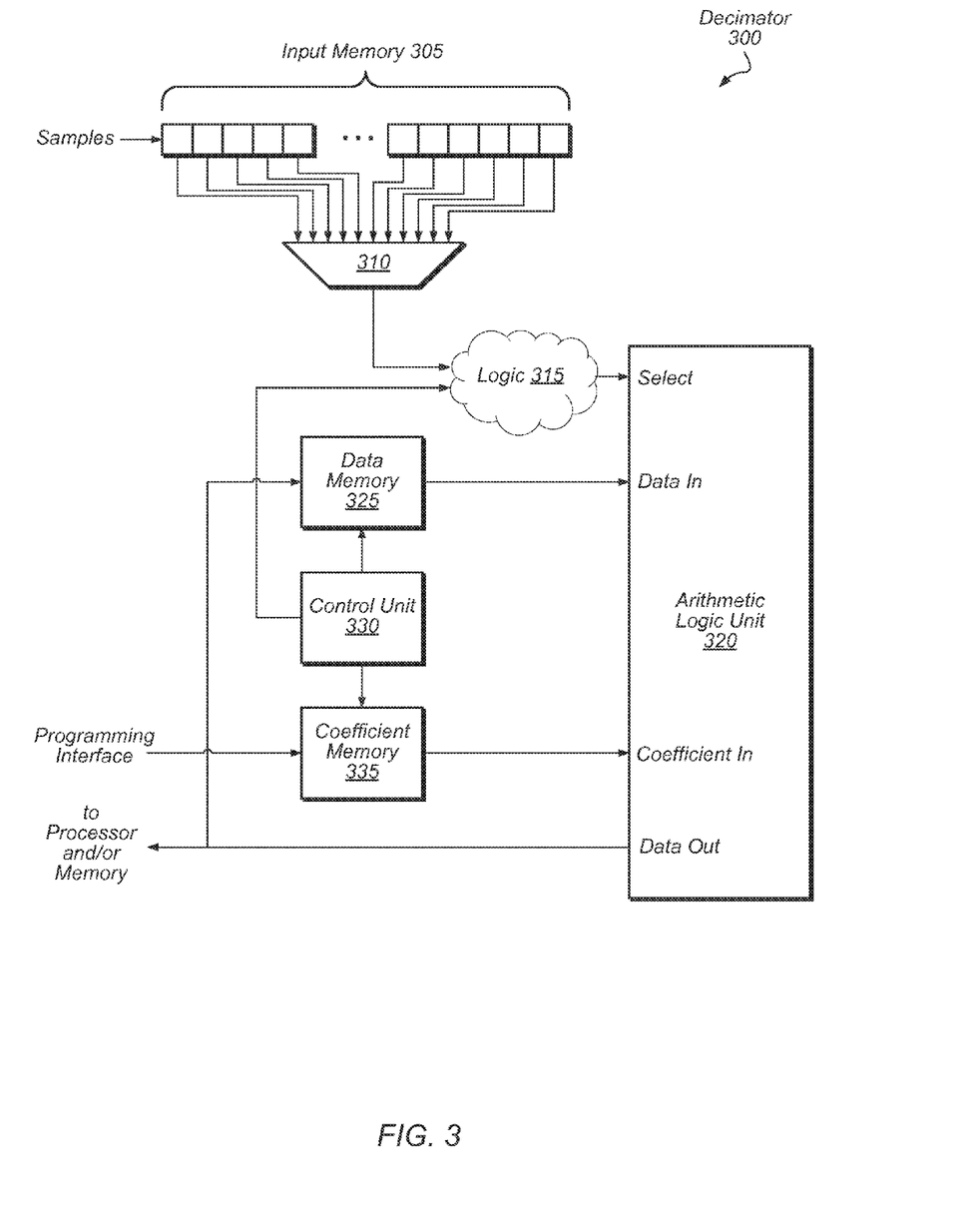
FIG. 3 is a block diagram of one embodiment of a decimator.

Referring now to FIG. 3, a block diagram of one embodiment of a decimator 300 is shown. In one embodiment, the decimators 204 and 206 (of FIG. 2) may include the logic of decimator 300. In one embodiment, decimator 300 may be configured to implement three decimation stages. In other embodiments, decimator 300 may be configured to implement other numbers of decimation stages. In one embodiment, the input sample frequency may be 1.6 MHz, and the first decimation stage may decimate the input samples by a factor of 10. In another embodiment, the input sample frequency may be 800 kHz and the first decimation stage may decimate the input samples by a factor of 5. During the first decimation stage, input samples from input memory 305 may be coupled to arithmetic logic unit (ALU) 320 via multiplexer 310 and logic 315. Input memory 305 may be any size of shift register chain, buffer, or other memory structure, depending on the embodiment. Control unit 330 may be configured to generate the select signal used by ALU 320 to determine which decimation stage to implement. In one embodiment, control unit 330 may implement a finite state machine (FSM) to control the various decimation stages of decimator 300.

In one embodiment, the second decimation stage may decimate the samples generated by the first decimation stage by a factor of 5 and the third decimation stage may decimate the samples generated by the second decimation stage by a factor of 2. In one embodiment, the output from the third decimation stage may be 16-bit PCM samples at a 16 kHz sample rate. It should be understood that these input and output sample frequencies and decimation factors are merely indicative of one embodiment. In other embodiments, other input and output sample frequencies and decimation factors may be utilized.

In one embodiment, ALU 320 may utilize a finite impulse response (FIR) filter for decimating the received samples in each of the decimation stages. ALU 320 may perform lookups of coefficient memory 335 to implement the FIR filter for one or more of the decimation stages. Coefficient memory 335 is representative of any number and type of memory structures (e.g., lookup tables, hard-coded values)

which may be utilized to store filter coefficient values and/or combinations of filter coefficient values. In some embodiments, ALU 320 may perform lookups of coefficient lookup tables to retrieve corresponding coefficient combination values. This will be described in further detail below. In one embodiment, in one or more of the decimation stages, ALU 320 may perform lookups of coefficient memory 335 using a plurality of input samples to reduce power consumption by reducing the total number of lookups. Coefficient memory 335 may be loaded with coefficient values by a processor via the programming interface in various embodiments. In one embodiment, ALU 320 may perform lookups of coefficient memory 335 using concatenated values including a plurality of input samples for only the first decimation stage. ALU 320 may store the results of each decimation stage in data memory 325 and access these results for subsequent decimation stages.

It is noted that the number and type of components of decimator 300 may vary from embodiment to embodiment. There may be more or fewer of each component than the number shown in FIG. 3. It is also noted that decimator 300 may include other components not shown in FIG. 3 and/or may omit one or more of the illustrated components. It should also be understood that the distribution of functionality illustrated in FIG. 3 is not the only possible arrangement of components which may be utilized for decimator 300. Other decimators may include a different arrangement of functionality among the components.

Figure 4:
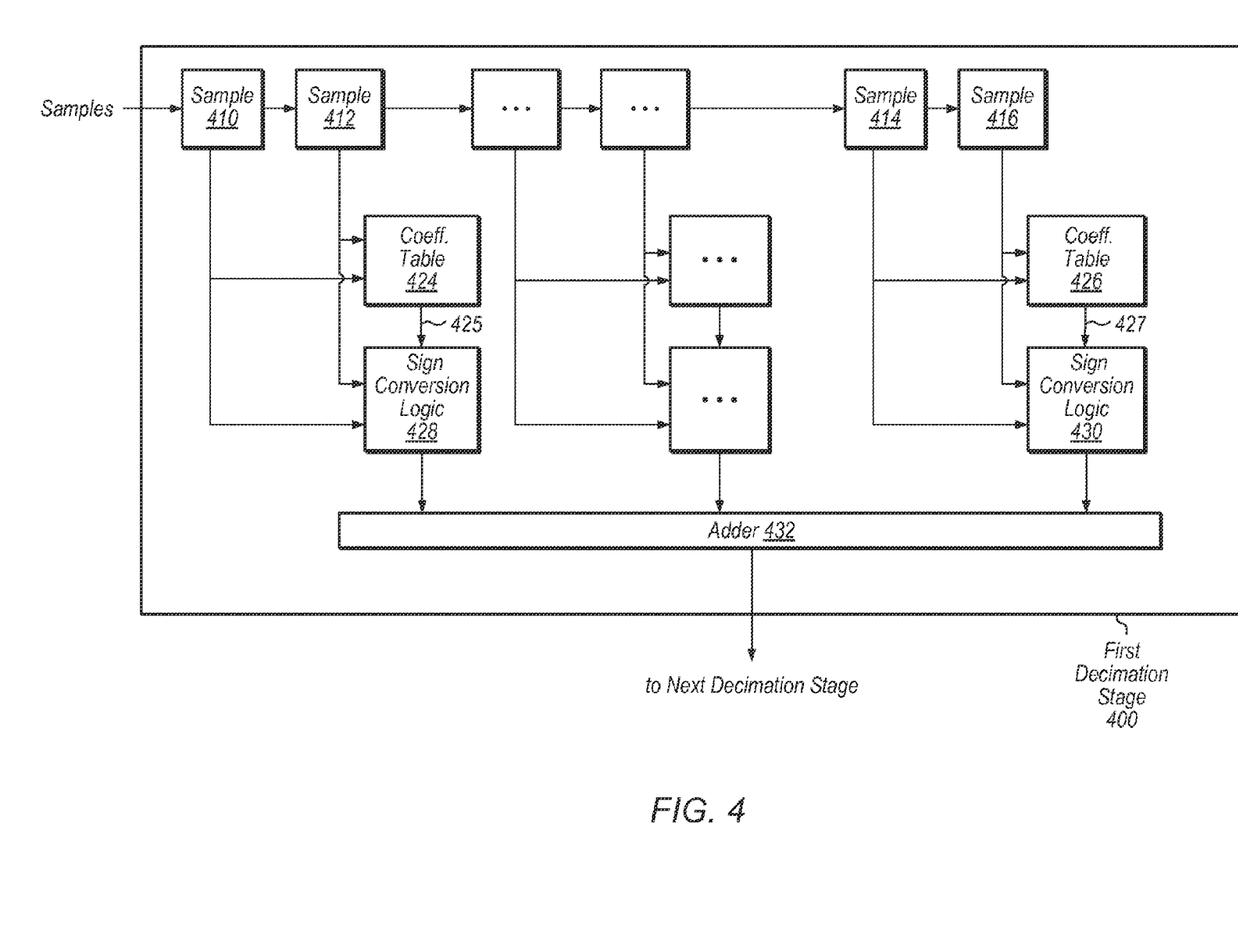
FIG. 4 is a logical block diagram of one embodiment of a first decimation stage.

Turning now to FIG. 4, a logical block diagram of one embodiment of a first decimation stage 400 is shown. In one embodiment, first decimation stage 400 may be implemented in software executed by a processing unit (e.g., ALU 320 of FIG. 3) of a decimator (decimator 300 of FIG. 3). In another embodiment, first decimation stage 400 may be implemented in hardware configured to perform decimation as shown in FIG. 4. In other embodiments, any combination of hardware and/or software may be utilized to implement first decimation stage 400.

In one embodiment, first decimation stage 400 may receive samples 410-416 generated from an audio signal captured by a microphone (not shown). In another embodiment, samples 410-416 may be captured from other types of signals. Samples 410-416 are representative of any number of samples which may be decimated by first decimation stage 400 in a given pass. In one embodiment, samples 410-416 may be from an oversampled one-bit PDM stream generated by a digital microphone. The sample frequency (e.g., 1.6 MHz, 800 kHz) may vary according to the embodiment.

In various embodiments, first decimation stage 400 may implement a FIR filter using lookups of one or more coefficient lookup tables. In one embodiment, first decimation stage 400 may utilize a minimum phase filter to decimate the input samples. In other embodiments, first decimation stage 400 may utilize other types of filters to decimate the input samples. In one embodiment, the FIR filter may be a 30-tap filter, and first decimation stage 400 may filter 30 samples at a time. In an embodiment when first decimation stage 400 decimates the input samples by a factor of 5, first decimation stage 400 may perform a filtering of 30 samples in a first step and then shift the next five input samples in to the shift registers 410-416 before filtering 30 samples in another step. In other embodiments, first decimation stage 400 may implement a filter with other numbers of taps and/or first decimation stage 400 may decimate the input samples 410-416 by other factors.

In one embodiment, first decimation stage 400 may combine two input samples and perform a lookup of a corresponding coefficient table using the combined two input samples. For example, as shown, the concatenation of samples 410 and 412 may be used to perform a lookup of coefficient table 424. In other embodiments, first decimation stage 400 may combine other numbers of input samples. Coefficient table 424 may only store the non-redundant values needed to represent all possible coefficient combination values based on all possible values of samples 410 and 412. Then, the output 425 of coefficient table 424 may have its sign inverted or be left unchanged by sign conversion logic 428 depending on the values of samples 410 and 412. The output of sign conversion logic 428 may be coupled to adder 432. Any number of values may be coupled to adder 432 to be added together, with the number of values depending on the size of the filter, which may vary from embodiment to embodiment.

Similarly, the concatenation of samples 414 and 416 may be used to perform a lookup of coefficient table 426. Coefficient table 426 may store only the non-redundant values which are needed to represent all possible coefficient combination values based on the values of samples 414 and 416. For example, in one embodiment, when the coefficient applied to sample 414 is $C_0$ and the coefficient being applied to sample 416 is $C_1$, only two values may be stored in coefficient table 426 which are '$C_0+C_1$' and '$C_0-C_1$'. This may help reduce the size of coefficient table 426. In this embodiment, while only two values are stored in coefficient table 426, there may be four possible output values ($C_0+C_1$, $C_0-C_1$, $C_1-C_0$, and $-C_0-C_1$) based on the four different possible values of the concatenation of samples 414 and 416. To generate all four possible values from the two non-redundant values stored in coefficient table 426, the output 427 of coefficient table 426 may be coupled to sign conversion logic 430 which may perform sign inversion or leave unchanged the output 427 based on the values of samples 414 and 416. Any number of bits may be used to represent each coefficient value in coefficient tables 424-426, depending on the embodiment.

It is noted that while coefficient tables 424 and 426 are shown as separate tables, this is merely for the purposes of illustration. In other embodiments, a single table or memory may store all of the coefficients used for the various computations performed by first decimation stage 400. Additionally, while in one embodiment first decimation stage 400 may be implemented in hardware, in other embodiments, software may be utilized to implement any portion or the entirety of the above-described decimation.

Figure 5:
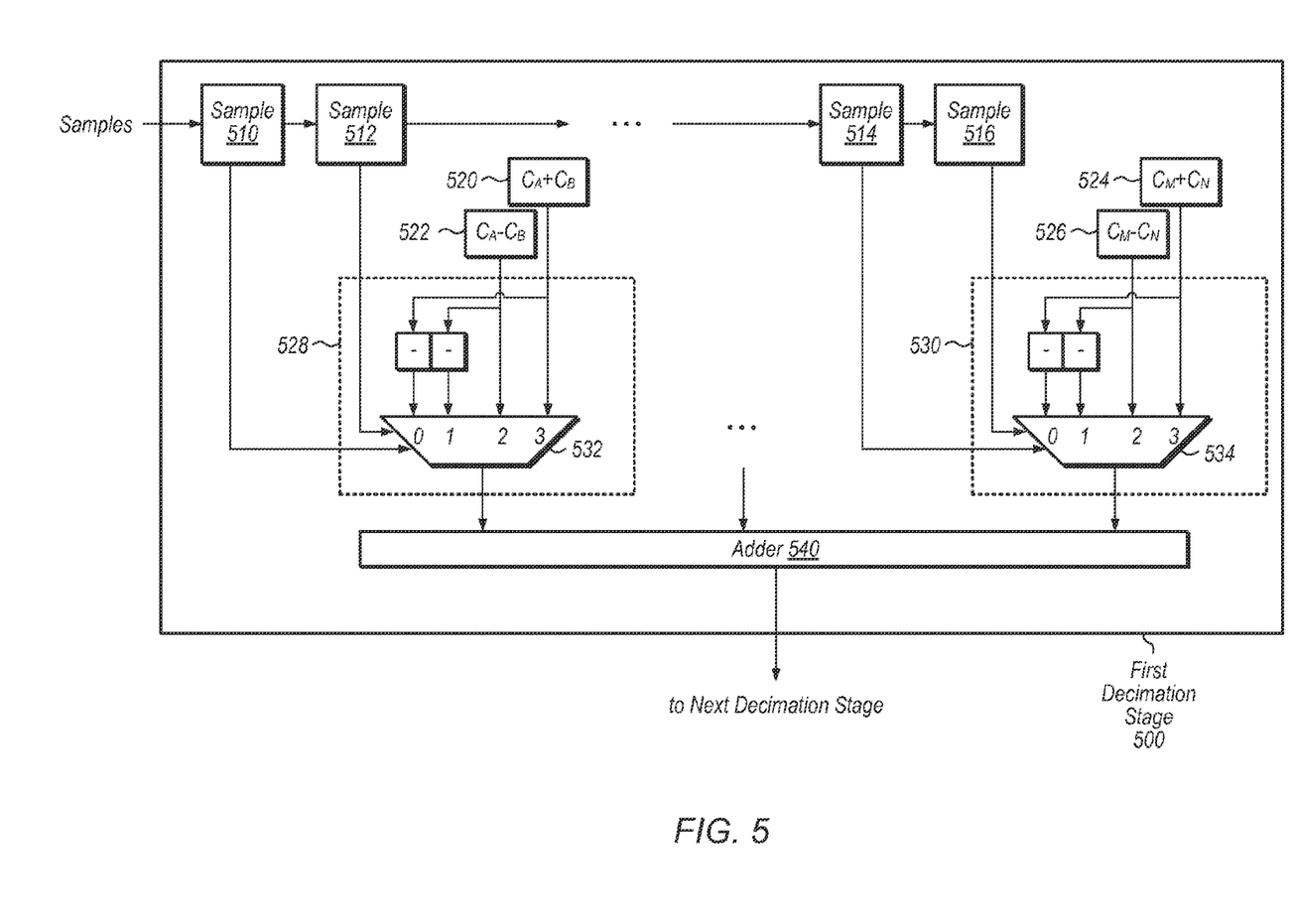
FIG. 5 is a logical block diagram of another embodiment of a first decimation stage.

Referring now to FIG. 5, a logical block diagram of another embodiment of a first decimation stage 500 is shown. First decimation stage 500 is intended to represent an alternate version of first decimation stage 400 of FIG. 4 for concatenating two input samples at a time to reduce power consumption. In various embodiments, any combination of hardware and/or software may be utilized to implement first decimation stage 500. In one embodiment, first decimation stage 500 may receive samples 510-516 generated from an audio signal captured by a digital microphone (not shown). In other embodiments, samples 510-516 may be captured from other types of signals (e.g., video signal, analog voltage signal).

It may be assumed for the purposes of this discussion that filter coefficient $C_A$ is being applied to sample 510 and filter coefficient $C_B$ is being applied to sample 512. Accordingly, two coefficient combination values 520 and 522 may be stored so as to perform the filtering of the concatenation of samples 510 and 512. Coefficient combination value 520 may be '$C_A+C_B$' while coefficient combination value 522 may be '$C_A-C_B$'. These two coefficient combination values 520 and 522 along with sign conversion logic 528 may be used to generate all four possible coefficient combination values which may be coupled to adder 540 depending on the values of samples 510 and 512. By only storing two coefficient combination values for each pair of input samples, the size of the coefficient lookup tables or coefficient memory may be reduced. Depending on the embodiment, coefficient combination values 520 and 522 may be stored in a lookup table, in a memory, or may be hard-coded values.

Coefficient combination values 520 and 522 may be coupled to sign conversion logic 528, which may invert the sign of coefficient combination value 520 or 522 depending on the values of samples 510 and 512. Sign conversion logic 528 may include logic for inverting the sign of filter coefficients 520 and 522, and sign conversion logic 528 may include multiplexer 532 to select the appropriate value to couple to adder 540. Sign conversion logic 528 is one example of an implementation of sign conversion logic 428 (of FIG. 4). In other embodiments, other suitable arrangements of circuit elements may be utilized to implement sign conversion logic 528. Similarly, samples 514 and 516 may be coupled to sign conversion logic 530, which may include multiplexer 534 to select the appropriate value to couple to adder 540 and may also include logic for inverting the sign of coefficient combination values 524 ($C_M+C_N$) and 526 ($C_M-C_N$).

Figure 6:
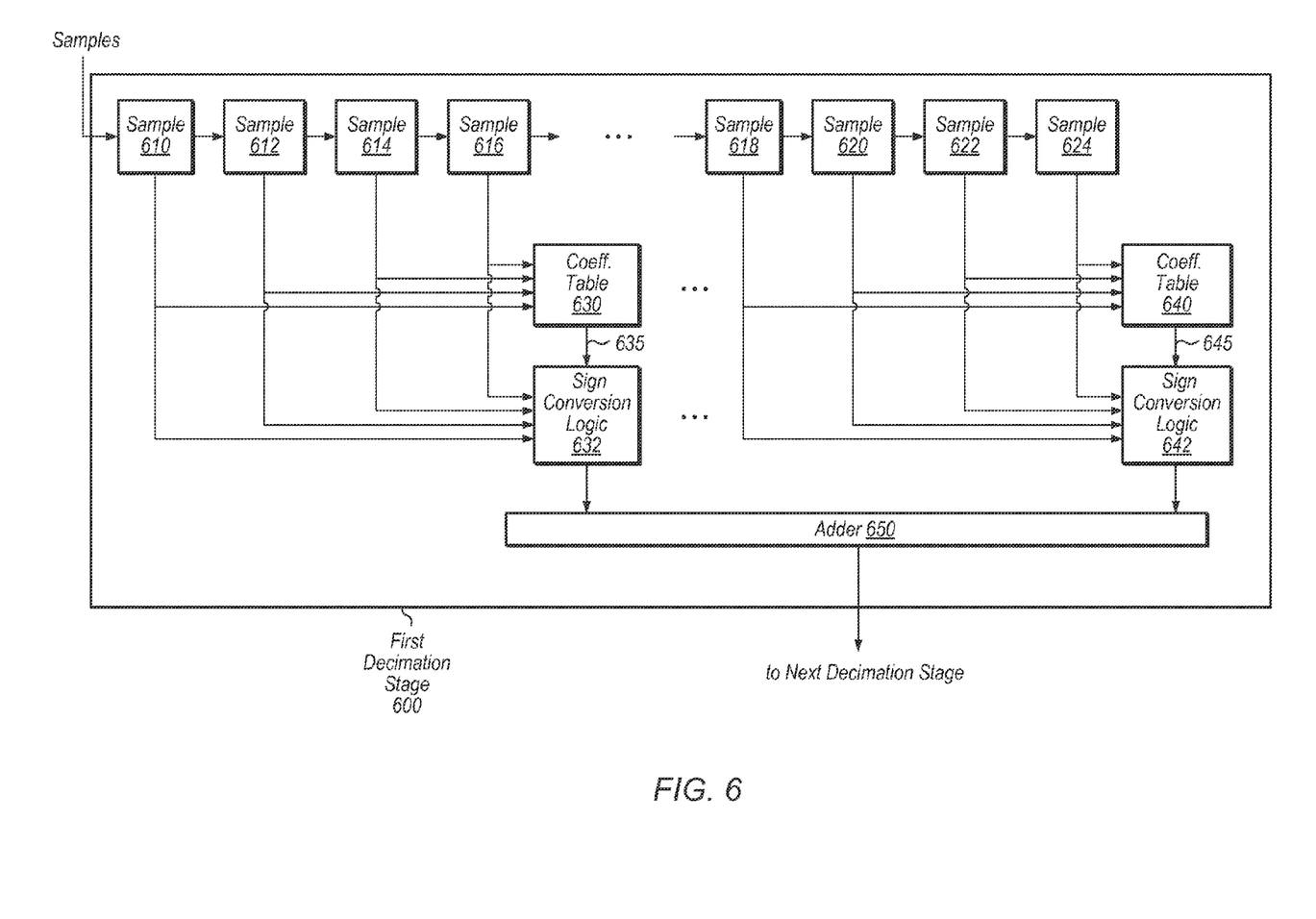
FIG. 6 is a logical block diagram of another embodiment of a first decimation stage.

Turning now to FIG. 6, a logical block diagram of another embodiment of a first decimation stage 600 is shown. In various embodiments, any combination of hardware and/or software may be utilized to implement first decimation stage 600. First decimation stage 600 may receive samples 610-624 from a digital microphone. Samples 610-624 are representative of any number of samples which may be decimated by first decimation stage 600. In one embodiment, samples 610-624 may be one-bit PDM samples. In contrast to first decimation stage 400 (of FIG. 4), first decimation stage 600 may utilize the concatenation of four samples to perform lookups of coefficient tables. It is noted that in other embodiments, first decimation stage 600 may utilize the concatenation of other numbers of samples to perform coefficient table lookups. The number of samples which may be concatenated for performing lookups may be any positive integer, depending on the embodiment.

In one embodiment, the concatenation of samples 610, 612, 614, and 616 may be utilized to perform a lookup of coefficient table 630. The result 635 of the lookup of coefficient table 630 may be coupled to sign conversion logic 632 which may invert the sign of result 635 or leave result 635 unchanged based on the values of samples 610, 612, 614, and 616. This allows coefficient table 630 to store only the non-redundant values of the coefficient combinations rather than all possible coefficient combinations for applying to samples 610, 612, 614, and 616. Similarly, the concatenation of samples 618, 620, 622, and 624 may be utilized to perform a lookup of coefficient table 640. The result 645 of the lookup of coefficient table 640 may be coupled to sign conversion logic 642 which may perform sign conversion on result 645 or leave result 645 unchanged based on the values of samples 618, 620, 622, and 624. The outputs of sign conversion logic 632 and 642 and the outputs of any number of other sign conversion logic units (depending on the number of samples being decimated) may be coupled to adder 650. The output of adder 650 may be coupled to the next decimation stage, a memory, a processor, and/or another component (not shown).

Figure 7:
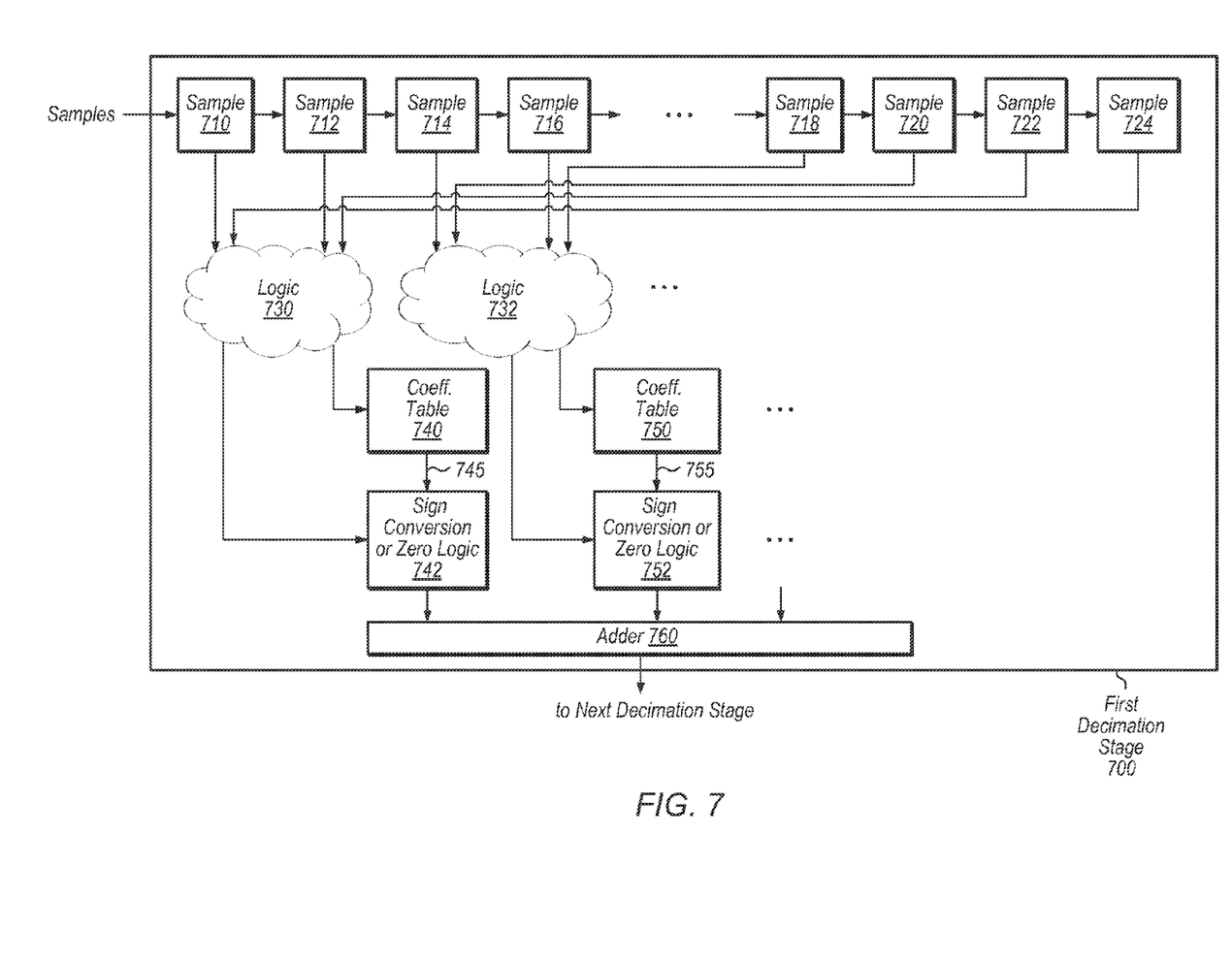
FIG. 7 is a logical block diagram of another embodiment of a first decimation stage.

Referring now to FIG. 7, a logical block diagram of another embodiment of a first decimation stage 700 is shown. In various embodiments, any combination of hardware and/or software may be utilized to implement first decimation stage 700. In one embodiment, first decimation stage 700 may be utilized to implement a linear phase filter to perform the decimation of input samples. Samples may be received by first decimation stage 700 and shifted in through sample shift registers 710-724, which are representative of any number of shift registers. In one embodiment, first decimation stage 700 may include 30 shift registers to implement a 30-tap linear phase filter. In other embodiments, first decimation stage 700 may include other numbers of shift registers to implement other sizes of linear phase filters.

In this embodiment, since first decimation stage 700 is implementing a linear phase filter, the coefficients of the linear phase filter may be symmetric. Therefore, the coefficient applied to sample 710 is the same as the coefficient applied to sample 724, the coefficient applied to sample 712 is the same as the coefficient applied to sample 722, and so on. Accordingly, in one embodiment, sample 710 and sample 724 may be coupled to logic 730 and sample 712 and sample 722 may also be coupled in logic 730. An output from logic 730 may be coupled to coefficient table 740 and another output of logic 730 may be coupled to sign conversion or zero logic unit 742. Similarly, sample 714 and sample 720 may be coupled to logic 732 and sample 716 and sample 718 may also be coupled to logic 732, with an output of logic 732 being coupled to coefficient table 750 and another output of logic 732 being coupled to sign conversion or zero logic unit 752. In other embodiments, other numbers of pairs of non-contiguous samples from the input stream may be processed together and used to perform coefficient table lookups.

The results 745 and 755 of lookups of coefficient tables 740 and 750, respectively, may be coupled to sign conversion or zero logic units 742 and 752, respectively. Sign conversion or zero logic units 742 and 752 may perform sign inversion, zero, or leave unchanged the results depending on the values of the corresponding logic outputs. This allows the size of coefficient tables 740 and 750 to be minimized by storing only the non-redundant values of coefficient combinations needed to generate all possible coefficient combination values.

Figure 8:
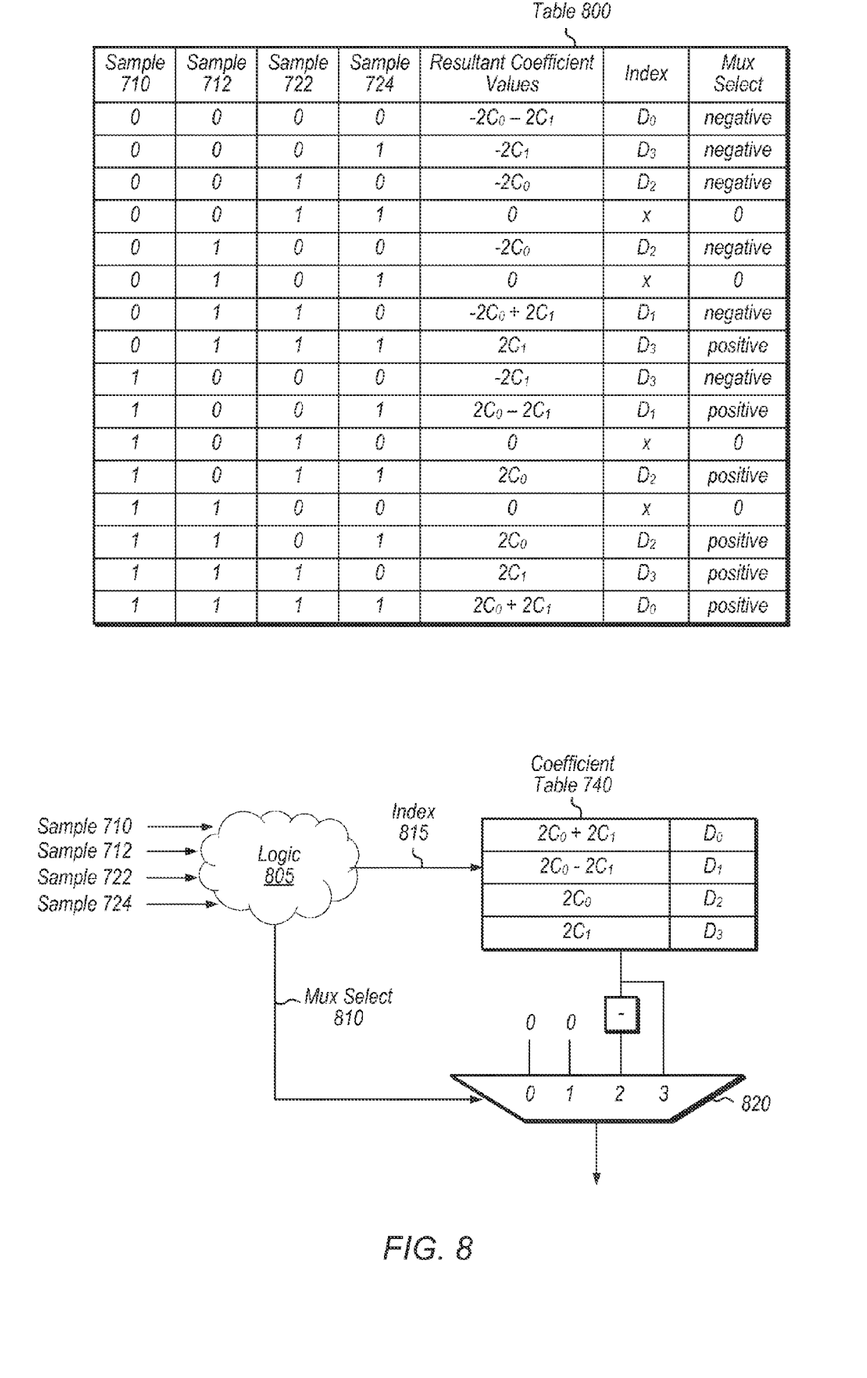
FIG. 8 illustrates one embodiment of a coefficient table and corresponding control logic.

Referring now to FIG. 8, one embodiment of table 800 and coefficient table 740 and corresponding logic is shown. Table 800 illustrates the resultant coefficient combination values based on applying filter coefficients $C_0$ and $C_1$ to corresponding samples for all possible values of the four samples 710, 712, 722, and 724 (of FIG. 7). It may be assumed for the purposes of this discussion that linear phase filter coefficient $C_0$ is being applied to samples 710 and 724 and that linear phase filter coefficient $C_1$ is being applied to samples 712 and 722. Accordingly, there are 16 possible combinations of the four samples 710, 712, 722, and 724 which can create nine different coefficient combination values: $2*C_0+2*C_1$, $2*C_0-2*C_1$, $-2*C_0+2*C_1$, $-2*C_0-2*C_1$, $2*C_0$, $2*C_1$, $-2*C_0$, $-2*C_1$, and 0.

However, rather than storing all nine of these different coefficient combination values in coefficient table 740, only the four non-redundant values ($2*C_0+2*C_1$, $2*C_0-2*C_1$, $2*C_0$, $2*C_1$) may be stored in coefficient table 740. A sign conversion or zero logic unit may be used to generate the negative of the value retrieved from coefficient table 740 or generate zero based on the values of samples 710, 712, 722, and 724. In other embodiments, with other types of filters and other numbers of samples used to perform lookups, other coefficient combination values may be generated and other numbers of non-redundant values may be stored in a corresponding coefficient table.

As shown at the bottom of FIG. 8, samples 710, 712, 722, and 724 may be coupled to logic 805, and logic 805 may generate index $D_x$ (wherein 'x' is 0, 1, 2, or 3) from the input samples. Examples of index $D_x$ values are shown in table 800. The index $D_x$ may be coupled to coefficient table 740 to select the coefficient combination value which is coupled to mux 820. The mux select signal 810 generated by logic 805 may determine which value is coupled through to the output of mux 820. It is noted that this is merely one example of logic which may be used to select the correct coefficient combination value based on the values of four samples to implement a linear phase filter. Other suitable arrangements of logic may be utilized in other embodiments.

Figure 9:
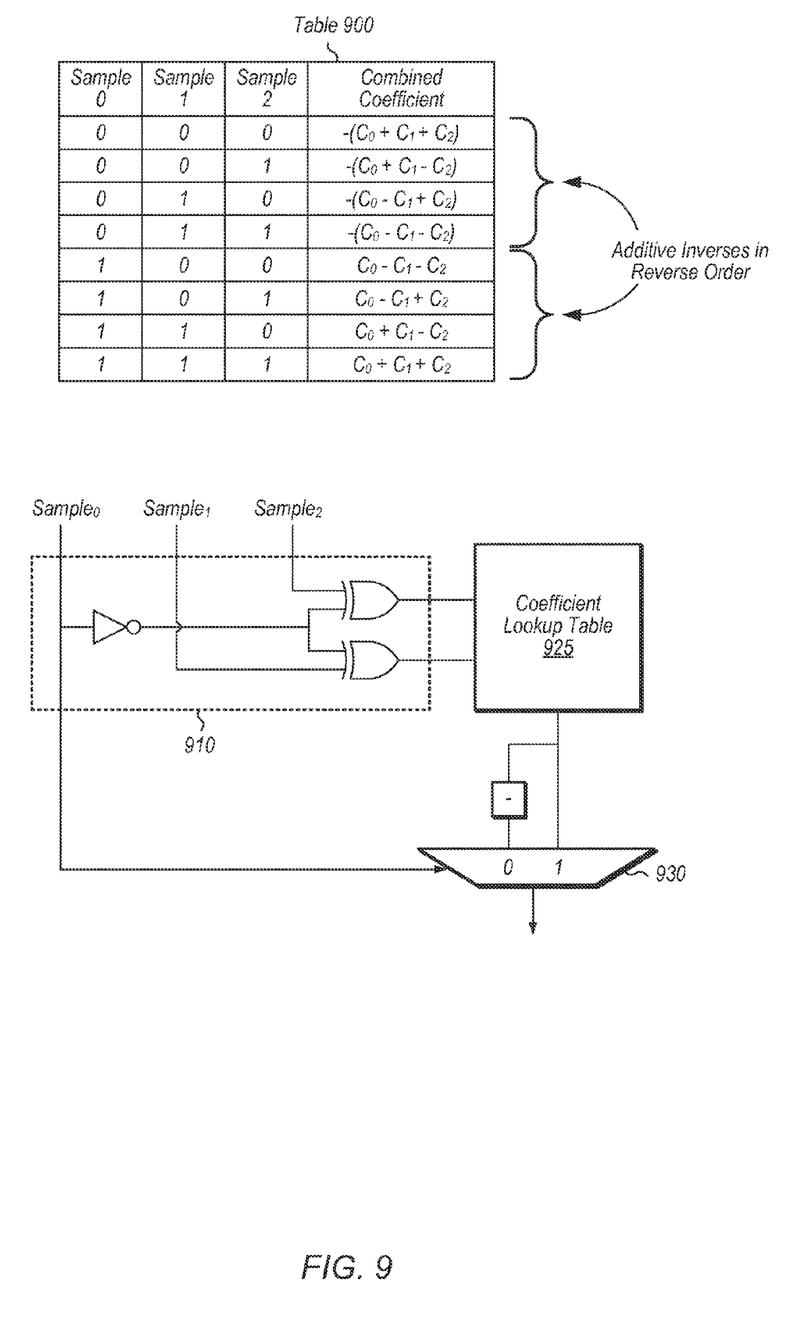
FIG. 9 illustrates another embodiment of a coefficient table and corresponding control logic.

Referring now to FIG. 9, another embodiment of a table 900, coefficient table 925, and corresponding logic 910 is shown. Table 900 illustrates the combined coefficient values that may be utilized when processing three samples at a time. The four combined coefficient values shown for the first four entries of table 900 are additive inverses in reverse order of the four combined coefficient values for the last four entries of table 900. Accordingly, in an embodiment where three samples are processed together, only four separate combined coefficient values may be stored in a coefficient lookup table (e.g., coefficient lookup table 925). These four combined coefficient values may be '$C_0+C_1+C_2$', '$C_0+C_1-C_2$', '$C_0-C_1+C_2$', and '$C_0-C_1-C_2$'.

One example of logic 910 which may be utilized to generate an index input to coefficient lookup table 925 is shown at the bottom of FIG. 9. Sample 0 may be input to an inverter, and the output of this inverter may be coupled to an input of two separate xor gates. Sample 1 may be coupled to the other input of the first xor gate and sample 2 may be coupled to the other input of the second xor gate. The outputs of the first and second xor gates may be coupled to coefficient lookup table 925. The result of the lookup of coefficient lookup table 925 may be coupled to the '1' input of mux 930 and the sign inverted lookup result of coefficient lookup table 925 may be coupled to the '0' input of mux 930. Sample 0 may be the select signal coupled to mux 930 to select either the '0' or '1' input of mux 930 to be coupled to the output of mux 930.

Figure 10:
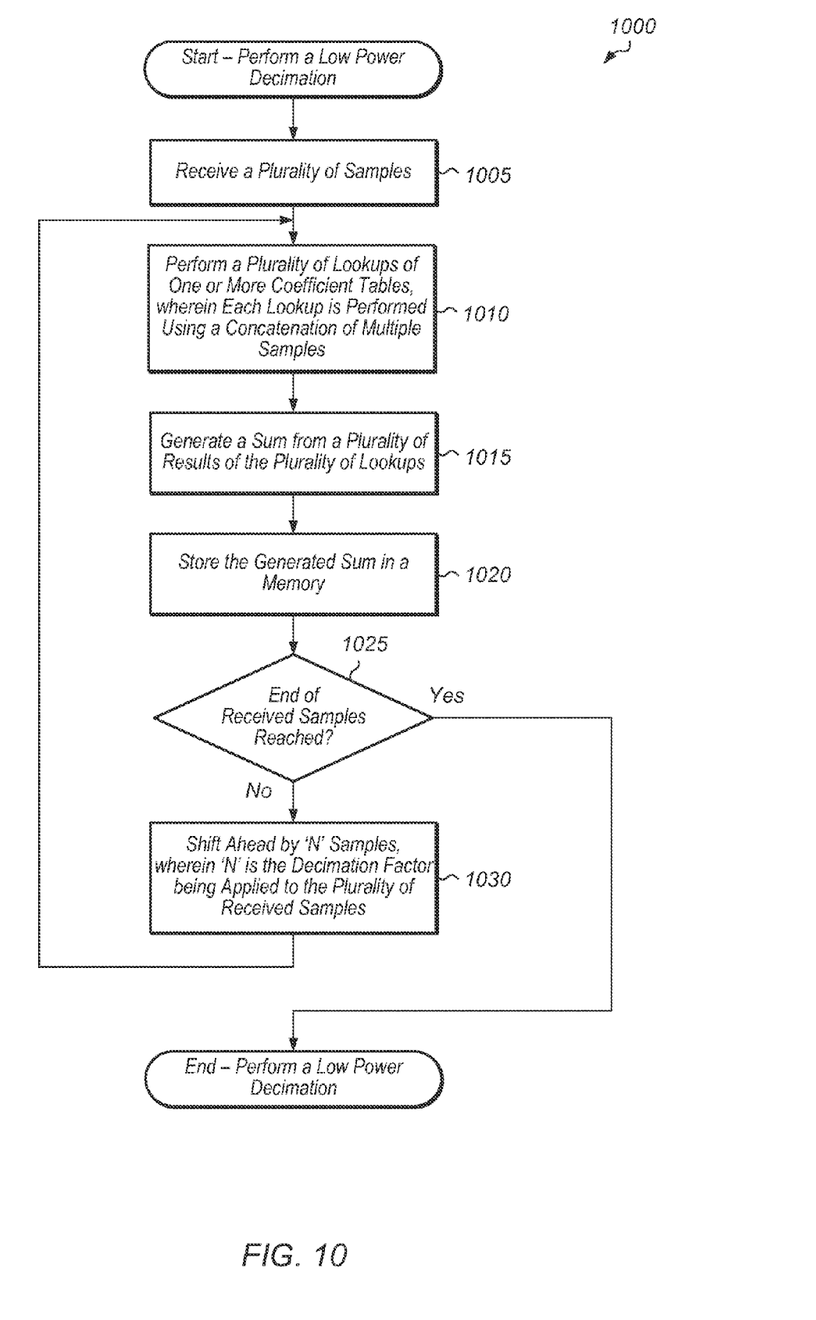
FIG. 10 is a generalized flow diagram illustrating one embodiment of a method for performing low power decimation.

Referring now to FIG. 10, one embodiment of a method 1000 for performing low power decimation is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems and/or apparatuses described herein may be configured to implement method 1000.

A decimator may receive a plurality of samples (block 1005). In one embodiment, the plurality of samples may be from an oversampled one-bit PDM stream. In other embodiments, the plurality of samples may be in other formats. In one embodiment, the plurality of samples may be received from a digital microphone. In another embodiment, the plurality of samples may be retrieved from a memory. In other embodiments, the plurality of samples may be received from other circuitry.

The decimator may perform a plurality of lookups of one or more coefficient tables, wherein each lookup of the plurality of lookups is performed using a concatenation of multiple samples (block 1010). In one embodiment, each group of multiple samples may be a non-overlapping subset of the plurality of samples received by the decimator. For example, the decimator may perform a first lookup using a concatenation of a first plurality of samples, a second lookup using a concatenation of a second plurality of samples, a third lookup using a concatenation of a third plurality of samples, and so on. The result of each lookup may be a coefficient combination value retrieved from the one or more coefficient tables. In one embodiment, all of the coefficient combinations may be stored in a single coefficient table or memory. In another embodiment, a separate coefficient table may be utilized for each lookup.

Next, the decimator may generate a sum from a plurality of results of the plurality of lookups (block 1015). Then, the decimator may store the generated sum in a memory (block 1020). Next, the decimator may determine if the end of the plurality of received samples has been reached (conditional block 1025). If the end of the plurality of received samples has not been reached (conditional block 1025, "no" leg), then the decimator may shift ahead by 'N' samples through the plurality of received samples, wherein 'N' is the decimation factor being applied to the plurality of received samples (block 1030). After block 1030, method 1000 may return to block 1010 with the decimator performing a plurality of lookups of the one or more coefficient tables for the next plurality of received samples. If the end of the plurality of received samples has been reached (conditional block 1025, "yes" leg), then method 1000 may end. Alternatively, in another embodiment, after conditional block 1025, another round of decimation may be performed on the generated sums.

Figure 11:
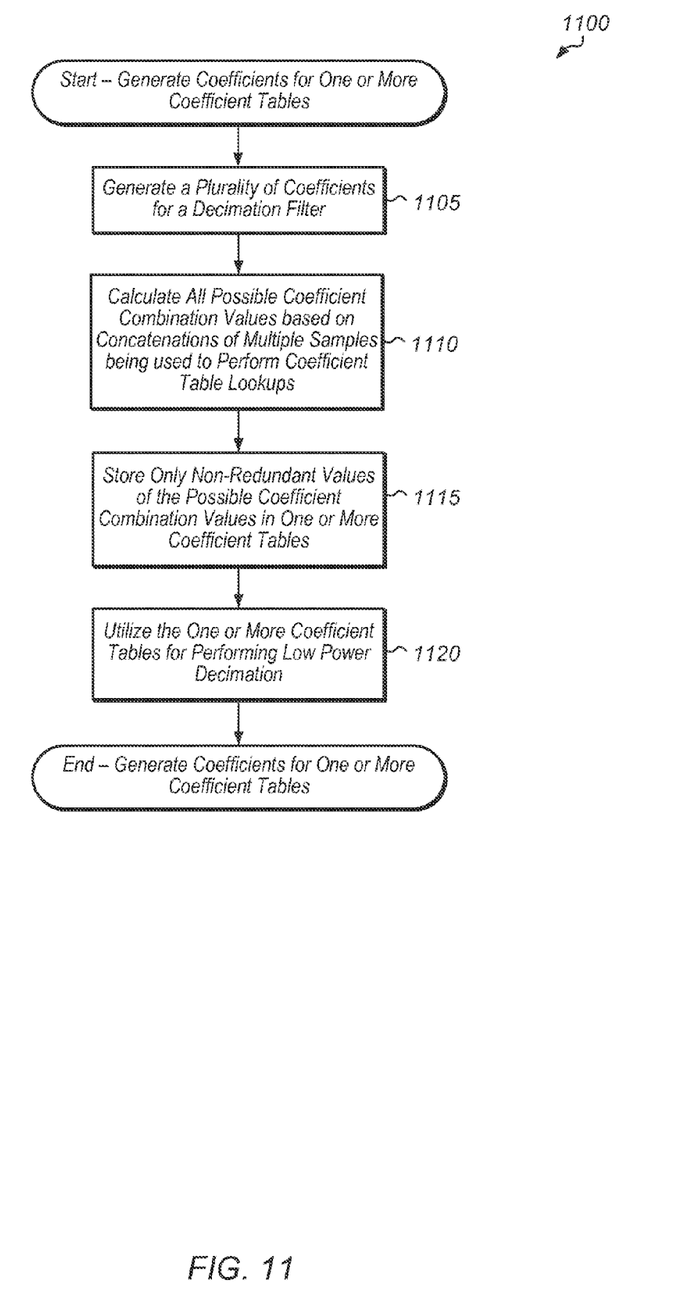
FIG. 11 is a generalized flow diagram illustrating one embodiment of a method for generating coefficients for one or more coefficient tables.

Turning now to FIG. 11, one embodiment of a method 1100 for generating coefficients for one or more coefficient tables is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired. Any of the various systems and/or apparatuses described herein may be configured to implement method 1100.

A plurality of coefficients may be generated for a decimation filter (block 1105). In one embodiment, the decimation filter may be a finite impulse response (FIR) filter. The FIR filter may be utilized for decimating an input signal. In one embodiment, the input signal may be an audio signal captured by a digital microphone. In one embodiment, the FIR filter may be a linear phase filter. In another embodiment, the FIR filter may be a minimum phase filter. In other embodiments, the decimation filter may be other types of filters. Next, all possible coefficient combination values may be calculated based on concatenations of multiple samples being used to perform coefficient table lookups (block 1110). For example, if coefficient values $C_0$ and $C_1$ are normally applied to input samples $X_1$ and $X_2$, and if input samples $X_1$ and $X_2$ are concatenated and used to perform a single lookup rather than two lookups, the calculated possible coefficient combination values for these combined input samples will be $C_0+C_1$, $C_0-C_1$, $-C_0+C_1$, and $-C_0-C_1$. In another embodiment, if four input samples are being combined, then there may be 16 calculated possible coefficient combination values. Generally speaking, for a non-symmetric decimation filter, if 'M' input samples are concatenated and used to perform a lookup, wherein 'M' is a positive integer greater than one, there will be $2^M$ possible coefficient combination values.

Next, only non-redundant values of the possible coefficient combination values may be stored in one or more coefficient tables (block 1115). This will help reduce the number of stored coefficient combination values and reduce the size of the one or more coefficient tables. As a result, the decimator may include sign conversion logic after the lookup table to invert the sign of the result of the lookup if the values of the corresponding samples are such that the result should be a negative value. Then, the one or more coefficient tables may be utilized for performing low power decimation (block 1120). After block 1120, method 1100 may end.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus configured to decimate a plurality of samples, wherein the apparatus comprises circuitry configured to:
   perform a plurality of lookups of one or more coefficient tables, wherein a first lookup of the plurality of lookups is performed using a concatenation of a first plurality of samples; and
   generate a sum of a plurality of results from the plurality of lookups;
   wherein only non-redundant values of coefficient combinations are stored in the one or more coefficient tables.

2. The apparatus as recited in claim 1, wherein the plurality of samples are one-bit pulse-density modulation (PDM) samples.

3. The apparatus as recited in claim 1, wherein the first plurality of samples are non-contiguous samples from a captured signal.

4. The apparatus as recited in claim 1, wherein the apparatus further comprises circuitry configured to determine whether to invert a sign of a first result of the first lookup based on values of the first plurality of samples.

5. The apparatus as recited in claim 4, wherein responsive to the first lookup, either of at least two values may be generated, a first value of the at least two values being a non-inverted form of the first result, and a second value of the at least two values being an inverted form of the first result.

6. The apparatus as recited in claim 1, wherein a first result of the first lookup is a sum of a plurality of coefficients.

7. The apparatus as recited in claim 1, wherein the plurality of samples are received from a digital microphone.

8. A method for decimating a plurality of samples, wherein the method comprising:
   performing a plurality of lookups of one or more coefficient tables, wherein a first lookup of the plurality of lookups is performed using a concatenation of a first plurality of samples; and
   generating a sum of a plurality of results from the plurality of lookups;
   wherein only non-redundant values of coefficient combinations are stored in the one or more coefficient tables.

9. The method as recited in claim 8, wherein the plurality of samples are one-bit pulse-density modulation (PDM) samples.

10. The method as recited in claim 8, wherein the first plurality of samples are non-contiguous samples from a captured signal.

11. The method as recited in claim 8, further comprising determining whether to invert a sign of a first result of the first lookup based on values of the first plurality of samples.

12. The method as recited in claim 11, wherein responsive to the first lookup, either of at least two values may be generated, a first value of the at least two values being a non-inverted form of the first result, and a second value of the at least two values being an inverted form of the first result.

13. The method as recited in claim 8, wherein a first result of the first lookup is a sum of a plurality of coefficients.

14. The method as recited in claim 8, wherein the plurality of samples are received from a digital microphone.

15. A computing system comprising:
   a memory;
   one or more coefficient tables; and
   decimator circuitry configured to:
      perform a plurality of lookups of the one or more coefficient tables, wherein a first lookup of the plurality of lookups is performed using a concatenation of a first plurality of samples; and
      generate a sum of a plurality of results from the plurality of lookups;
   wherein only non-redundant values of coefficient combinations are stored in the one or more coefficient tables.

16. The computing system as recited in claim 15, wherein the plurality of samples are one-bit pulse-density modulation (PDM) samples.

17. The computing system as recited in claim 15, wherein the first plurality of samples are non-contiguous samples from a captured signal.

18. The computing system as recited in claim 15, wherein the decimator is further configured to determine whether to invert a sign of a first result of the first lookup based on values of the first plurality of samples.

19. The computing system as recited in claim 15, wherein a first result of the first lookup is a sum of a plurality of coefficients.

20. The computing system as recited in claim 15, wherein the computing system further comprises a digital microphone, and wherein the decimator is configured to receive the plurality of samples from the digital microphone.

* * * * *